United States Patent
Yagi et al.

[11] Patent Number: 6,036,084
[45] Date of Patent: Mar. 14, 2000

[54] SCREEN PRINTING METHOD AND APPARATUS THEREFOR, AND ELECTRONIC COMPONENT SOLDERING METHOD USING SCREEN PRINTING AND APPARATUS THEREFOR

[75] Inventors: Hiroshi Yagi; Hiroyuki Ohira, both of Chiba, Japan

[73] Assignee: TDK Corporation, Japan

[21] Appl. No.: 08/856,906

[22] Filed: May 15, 1997

[30] Foreign Application Priority Data

Feb. 6, 1997 [JP] Japan .................................. 9-038381
Feb. 6, 1997 [JP] Japan .................................. 9-038382

[51] Int. Cl.⁷ ............................ B23K 35/12; B23K 1/00; B23K 31/02; B05D 5/12
[52] U.S. Cl. .......................... 228/248.1; 228/33; 228/42; 228/219; 228/261; 427/96
[58] Field of Search ............................ 228/248.1, 180.21, 228/218, 219, 245, 261, 42, 6.2, 37, 33; 427/294, 96

[56] References Cited

U.S. PATENT DOCUMENTS

| | | |
|---|---|---|
| 4,552,300 | 11/1985 | Zovko et al. |
| 4,878,378 | 11/1989 | Harada ................................ 73/54.35 |
| 4,960,236 | 10/1990 | Hedges et al. ...................... 228/180.1 |
| 5,244,144 | 9/1993 | Osame et al. ........................... 228/219 |
| 5,336,928 | 8/1994 | Neugebauer et al. ................... 257/758 |
| 5,427,303 | 6/1995 | Nowotarski ......................... 228/180.22 |
| 5,526,978 | 6/1996 | Nagatsuka et al. . |
| 5,586,715 | 12/1996 | Schwiebert et al. ................. 228/248.1 |
| 5,595,952 | 1/1997 | Maeda et al. ........................... 502/162 |
| 5,609,290 | 3/1997 | Bobbio et al. .......................... 228/206 |
| 5,656,933 | 8/1997 | Frederickson et al. ................. 324/693 |
| 5,751,910 | 5/1998 | Bryant et al. .............................. 706/2 |
| 5,770,173 | 6/1998 | Nitta et al. ............................. 423/593 |
| 5,778,638 | 7/1998 | Watanabe et al. ....................... 53/432 |
| 5,871,808 | 2/1999 | Thompson, Sr. ......................... 427/96 |

FOREIGN PATENT DOCUMENTS

| | | |
|---|---|---|
| 0469 848 A2 | 5/1992 | European Pat. Off. . |
| 0859540 | 8/1998 | European Pat. Off. . |
| 2 132 538 | 7/1984 | United Kingdom . |

*Primary Examiner*—Patrick Ryan
*Assistant Examiner*—Kiley Stoner
*Attorney, Agent, or Firm*—Lerner, David, Littenberg, Krumholz & Mentlik, LLP

[57] ABSTRACT

Screen printing and chip mounting are executed in a dry air atmosphere to prevent generation of solder balls due to absorption of moisture by a flux ingredient of paste solder. Screen printing of the solder on a board takes place in a space which has the board, a printing screen and a squeegee arranged therein and is formed therein with a dry air atmosphere having a pressure slightly higher than that of an atmosphere outside the space. Likewise, mounting of a chip on the board is carried out in a like space. Also, a reflow step is executed in a reflow oven kept at a dry air atmosphere.

17 Claims, 4 Drawing Sheets

SCREEN PRINTING METHOD AND APPARATUS THEREFOR, AND ELECTRONIC COMPONENT SOLDERING METHOD USING SCREEN PRINTING AND APPARATUS THEREFOR

BACKGROUND OF THE INVENTION

This invention relates to methods and apparatus used in making electronic components. In particular, the invention relates to a method for screen printing paste solder onto a board and an apparatus therefor, a method for soldering an electronic component onto a board using screen printing and an apparatus therefor.

Figure 1:
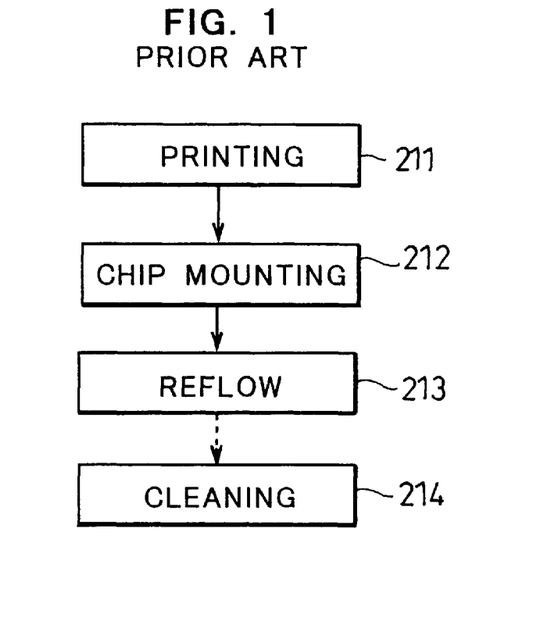
FIG. 1 is a block diagram showing the steps of a conventional method for soldering an electronic component.

An electronic component (hereinafter also referred to as "chip" is conventionally soldered onto a board as shown in FIG. 1. More specifically, first a printing step 211 is executed to print creamed solder or paste solder onto a board by a screen printing apparatus. Then, a chip mounting step 212 is carried out to mount a chip or chips on the board by means of a chip mounting apparatus. This is followed by execution of a reflow step 213, wherein the paste solder is melted in a reflow oven to fix the chip or chips on the board.

Such soldering is conventionally practiced in an open air atmosphere. Unfortunately, solder balls are dissociated from lands on the board during the soldering in the reflow oven. [No] soldering under increased moisture conditions causes generation of a number of solder balls to become dissociated from the land of the board, leading to a failure in the board.

To reduce the cleaning step normally required after soldering a chip or chips onto a board, the flux ingredient contained in the past solder is desirably reduced. Unfortunately, reflow soldering is conventionally carried out in the open air atmosphere, and a reduction in flux content in the paste solder fails to permit the paste solder to exhibit satisfactory soldering characteristics.

Thus, the reflow step 213 is followed by a cleaning step 214, as shown in FIG. 1.

It is conventionally proposed to carry out reflow soldering in a closed nitrogen atmosphere for the purpose of preventing oxidation of the paste solder. Unfortunately, this requires a soldering system in a closed structure, leading to an increase in the cost of the system and deterioration in the efficiency of the system.

In view of the foregoing disadvantages of the conventional reflow soldering, the assignee proposed a reflow oven for carrying out reflow soldering in a dry air atmosphere, as disclosed in U.S. Pat. No. 5,526,978. The proposed reflow oven exhibits the advantages of minimizing the generation of solder balls eliminating the necessity of a soldering system in a closed structure, and attaining screen printing and reflow soldering on a large scale.

Nevertheless, in the art, past solder is printed on a board screen printing apparatus having an open air atmosphere and a chip or chips are mounted on the board in chip mounting apparatus having an open air atmosphere. Unfortunately, this causes either absorption of moisture by the flux ingredient of the paste solder or condensation or dewing of moisture on the applied paste solder during printing and chip mounting. This results in the increased generation of solder balls regardless of whether reflow soldering is conducted in a dry air atmosphere.

The inventors have found that when the reflow oven has a dry air atmosphere, both printing of the paste solder and chip mounting are desirably carried out in a dry air atmosphere. However, the prior art fails to accomplish such an operation.

SUMMARY OF THE INVENTION

The present invention has been made to address the foregoing disadvantages of the prior art.

Accordingly, it is an object of the present invention to provide a screen printing method which is capable of effectively preventing printed paste, such as paste solder, from absorbing moisture during screen printing.

It is another object of the present invention to provide a screen printing apparatus which is capable of effectively preventing printed paste such as paste solder from absorbing moisture during screen printing by conducting screen printing of the paste in a dry air atmosphere.

It is a further object of the present invention to provide a method for soldering an electronic component to a board which is capable of effectively preventing the generation of solder balls during reflow soldering in a dry air atmosphere and to eliminate cleaning of the board after soldering.

It is still another object of the present invention to provide an apparatus for soldering an electronic component to a board which is capable of effectively preventing the generation of solder balls during reflow soldering in a dry air atmosphere and which eliminates cleaning of a board after soldering.

In accordance with one aspect of the present invention, a screen printing method is provided. The screen printing method includes the step of carrying out screen printing of a printing paste on a board in a dry air atmosphere. The printing paste may be paste solder and the dry air atmosphere may have a humidity of 20% or less.

In accordance with another aspect of the present invention, a screen printing apparatus is provided. The screen printing apparatus includes an enclosure defining a treating space has a board, a printing screen and a squeegee for application of a printing paste arranged therein. The treating space is formed therein with a dry air atmosphere of a pressure slightly higher than that of an atmosphere outside the treating space.

In accordance with a further aspect of the present invention, a method for soldering an electronic component is provided. The method includes the steps of executing screen printing of paste solder on a board, mounting an electronic component on the board and subjecting the board and electronic component mounted thereon to reflow soldering, wherein the screen printing is executed in a dry air atmosphere. The dry air atmosphere may have a humidity of 20% or less. Also, at least one of the mounting and reflow soldering steps may be carried out in a dry air atmosphere.

In accordance with still another aspect of the present invention, an apparatus for soldering an electronic component is provided. The apparatus includes a screen printing unit for applying paste solder to a board by screen printing, a mounting unit for mounting an electronic component on the board and a reflow oven for carrying out reflow soldering, including an oven body provided with a heater and constructed so as to melt the paste solder on the board while the electronic component is mounted thereon. The screen printing unit includes an enclosure defining a treating space. The treating space is formed therein with a dry air atmosphere of a pressure slightly higher than that of an atmosphere outside the treating space.

In a preferred embodiment of the present invention, the mounting unit may include an enclosure defining a treating space having the board and mounting head arranged therein. The treating space of the chip mounting unit is formed therein with a dry air atmosphere of a pressure slightly higher than that of an atmosphere outside the treating space of the chip mounting unit.

In a preferred embodiment of the present invention, the oven body of the reflow oven is fed therein with dry air to form a dry air atmosphere in the oven body.

BRIEF DESCRIPTION OF THE DRAWINGS

These and other objects and advantages of the present invention will become better understood by reference to the following detailed description, when considered in connection with the accompanying drawings, wherein.

DETAILED DESCRIPTION OF THE PREFERRED EMBODIMENTS

Now, the present invention will be described hereinafter with references to the accompanying drawings.

Figure 2:
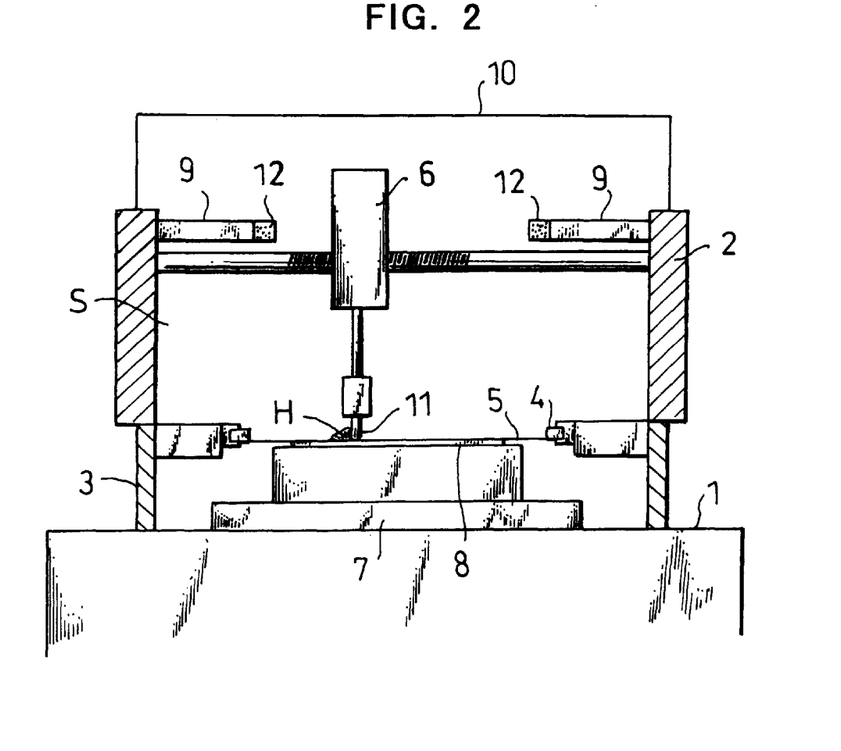
FIG. 2 is a schematic front view in section showing a screen printing apparatus which may be incorporated in the present invention.
Figure 3:
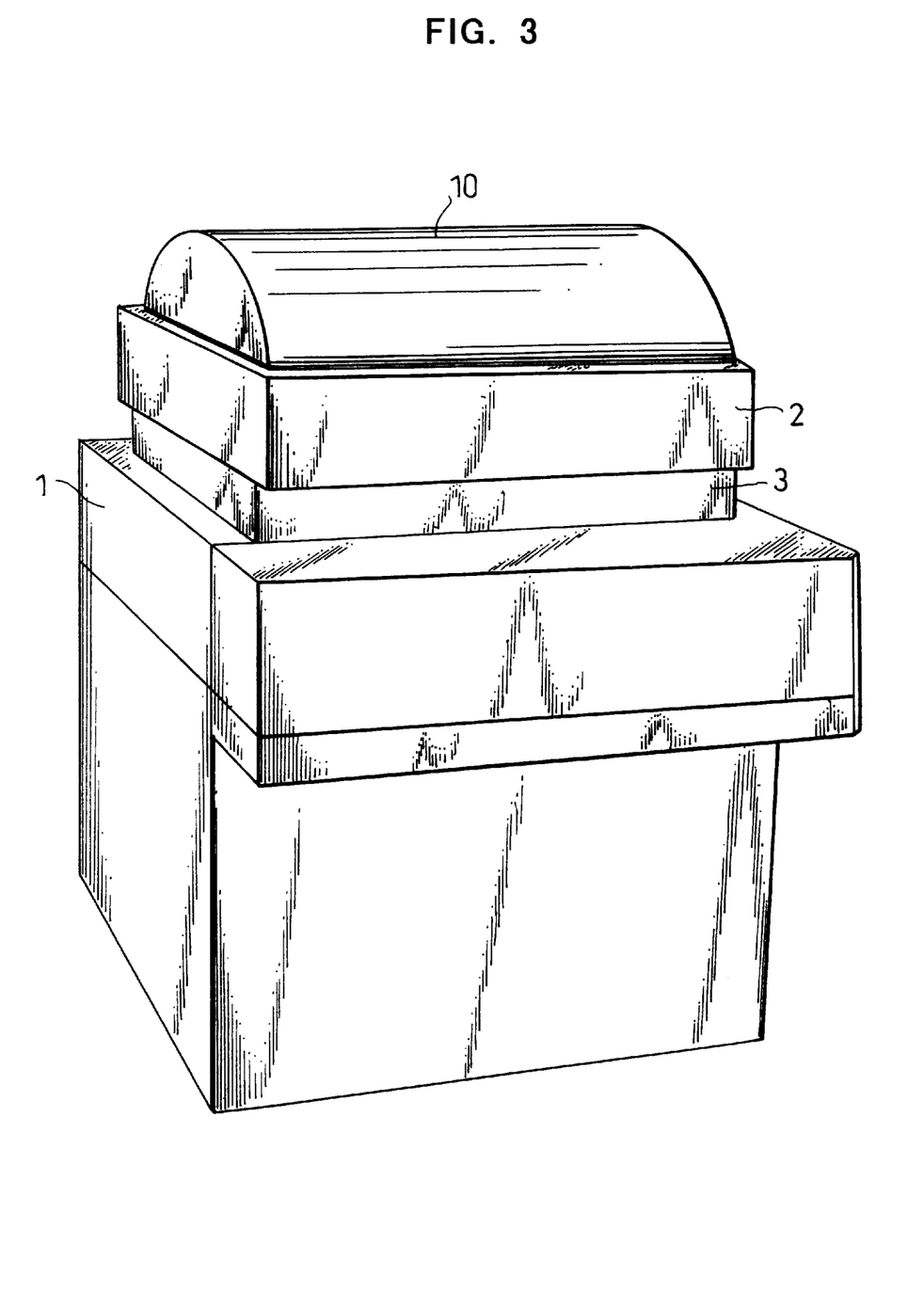
FIG. 3 is a perspective view of the screen printing apparatus shown in FIG. 2.
Figure 4:
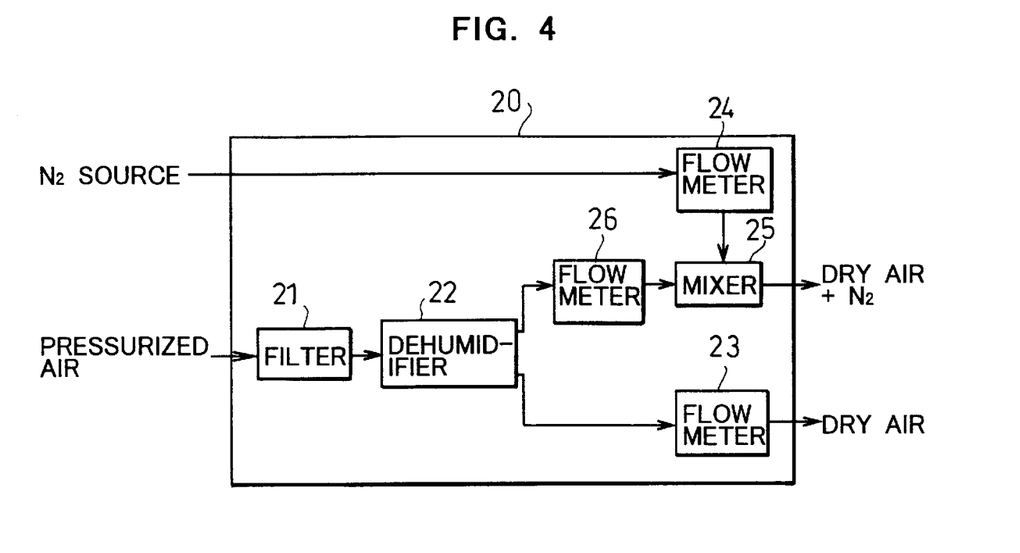
FIG. 4 is a block diagram showing a dry unit adapted to be used in the present invention.

First, a screen printing method and an apparatus therefor according to the present invention will be described with references to FIGS. 2 through 4, wherein FIGS. 2 and 3 show an embodiment of a screen printing apparatus according to the present invention and FIG. 4 shows a dry unit for feeding dry air to the screen printing apparatus.

As shown in FIGS. 2 and 3, the screen apparatus includes a base 1, a frame 2 for supporting a squeegee head 6, and a frame 3 for supporting a printing screen frame 4. The apparatus also includes a printing screen 5, an X-Y table 7 on which a board 8 is placed, and a dry air feed section 9. The apparatus further includes an airtight plastic cover 10 for an upper opening of the printing apparatus.

The frame 2 for supporting the squeegee head 6 and the frame 3 for supporting the printing screen frame 4 are securely mounted on the base 1. A lifting means on the frame 3 holds the printing screen frame 4 on the frame 3. Thus, the printing screen frame 4 is downwardly movable to a lowered position, to lay or superpose the printing screen 5 on the board 8 when the printing is desired. The frame 4 is upwardly movable to a raised position when replacement of the board 8 and/or printing screen 5 is desired. The squeegee head 6 is supported on the frame 2, for example, through an X-direction drive mechanism. The squeegee head 6 has a lower end thereof, a squeegee 11. The squeegee head 6 is constructed so as to be reciprocated in the frame 2 so that the board 8 is coated with past solder H from the screen 5 by the squeegee 11 mounted on the lower end of the squeegee head 6.

The base 1, frames 2 and 3, and plastic cover 10 cooperate with each other to form an essential part or an enclosure which forms a treating space S for printing the board 8, printing screen 5, and squeegee 11 are arranged in the spaces. Thus, the treating space S is formed with a dry air atmosphere of a pressure slightly higher than that of an atmosphere outside the treating space S. Also, the screen printing apparatus is provided with an elastic porous member for closing any gap which may possibly exist on a surface of the apparatus. A sponge material for example, may be used for this purpose. Thus, the treating space S is in the form of a substantially sealed space which is surrounded by the base 1, frames 2 and 3, and plastic cover 10. However, it is not necessarily required to construct the treating space S in a fully airtight manner so long as it permits dry air atmosphere of a pressure slightly higher than that of an atmosphere outside the treating space S to be formed therein. For this purpose, the screen printing apparatus may be constructed so that the area of an opening of the dry air feed section 9 is larger than the area of the gap.

The dry air feed section 9 is formed with an air outlet having a porous member 12, made of sintered metal or the like, so that dry air is fed through the porous member 12 to the treating space S for printing. The dry air is fed substantially without a flow velocity or is kept substantially free from having a flow velocity. The air outlet or opening of the dry air feed section 9 is desirably arranged at a position which prevents the dry air stream from blowing directly onto the board 8. For example, it may be arranged at a height corresponding to an upper portion of the squeegee head 6. The dry air desirably has a humidity of 20% or less.

The dry unit 20 in FIG. 4 is constructed so as to guide pressurized air from a compressor to a filter 21 to remove dust from the air. Next, the air is introduced into a dehumidifier 22 to remove moisture from the air, resulting in dry air being provided. Preferably, a humidity of the air is reduced to a level of 20% or less. The dry air is then fed through a flow meter 23 to the dry air feed section 9.

Nitrogen may be fed through a flow meter 24 to a mixer 25, if desired. The nitrogen is mixed with dry air emerging from the dehumidifier 22. A flow meter 26 is provided to prepare the mixed gas, which is then fed to the dry air feed section 9.

The above-described construction of the screen printing apparatus of the illustrated embodiment permits the treating space S for printing to be formed with a dry air atmosphere, which is substantially free from a flow velocity, and which has a pressure is kept at a level slightly higher than the atmosphere outside the space S. The squeegee 11 is reciprocated in the treating space S so that screen printing of paste solder H can be carried out. This effectively prevents a deterioration in paste solder H due to moisture during the screen printing. Thus, a flux ingredient contained in the paste solder H is prevented from absorbing moisture which prevents the generation of solder balls during subsequent reflow soldering. This eliminates the necessity of cleaning the board after it is mounted with electronic components and the like.

The use of dry air having a humidity of 20% or less further prevents the generation of use of solder balls.

In the illustrated embodiment, the paste solder H is printed as a printing paste. It should be apparent that the present invention may be effectively applied to any other printing paste that is easily affected by moisture.

As can be seen from the foregoing, the illustrated embodiment permits screen printing of a printing paste such as paste solder in a dry air atmosphere to prevent absorption of moisture by the printing paste and condensation of moisture on the printing paste. Fabrication and assembling of a board and electronic component is accomplished with increased reliability. Also, the application of the illustrated embodiment to screen printing of paste solder permits subsequent reflow soldering to be executed in a dry air atmosphere, successfully preventing the generation of solder balls, so that subsequent cleaning of the board may be eliminated.

Figure 5:
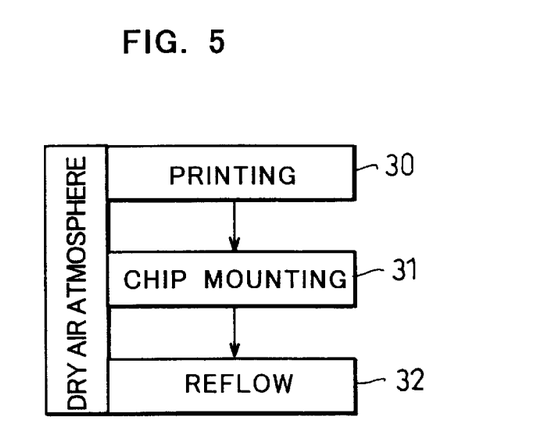
FIG. 5 is a block diagram showing the steps of soldering an electronic component according to the present invention'

Referring now to FIG. 5, soldering an electronic component or chip according to method of an other embodiment of the present invention is illustrated. The chip soldering method generally includes a printing step 30 including printing paste solder on a board shown in a screen printing apparatus which may be constructed as described above with reference to FIG. 2. The method also includes a chip mounting step 31 including mounting the chip on the board in a chip mounting apparatus. The method further includes a reflow step including melting the paste solder in a reflow oven to solder the chip on the board.

Figure 6:
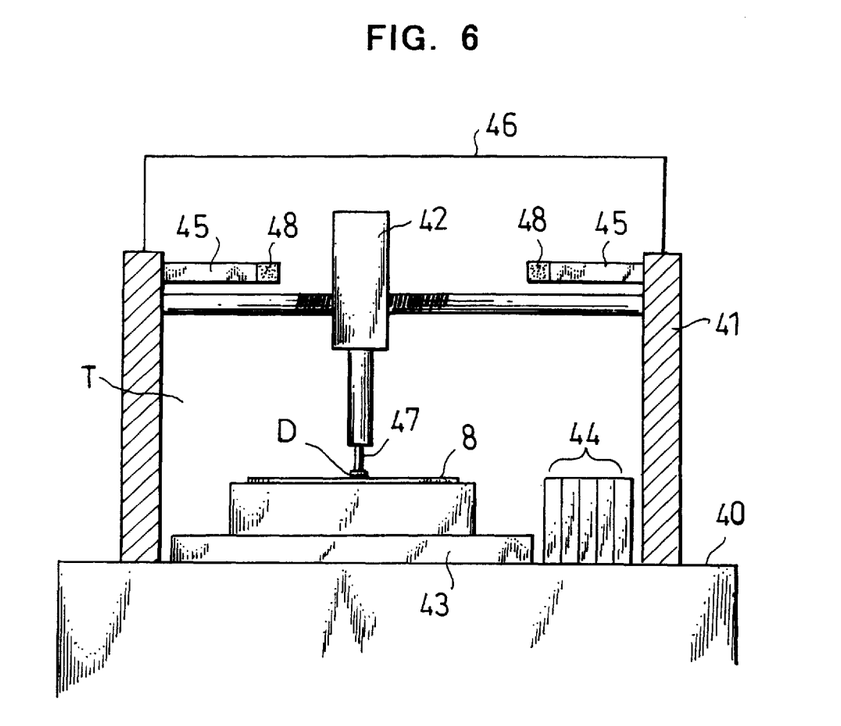
FIG. 6 is a schematic front elevation view in section showing a mounting apparatus for mounting the electronic component which may be incorporated in the present invention.

The chip mounting apparatus for the chip mounting step 31 may be constructed in such a manner as shown in FIG. 6, which is adapted to mount, in a dry air atmosphere, a chip on a board which is coated with paste solder applied by printing. FIG. 6 illustrates a base 40 for the chip mounting apparatus, a frame 41 for supporting a chip mounting head 42, an X-Y table 43 on which a board 8 is placed, a chip feed section 44, a dry air feed section 45, and a plastic cover 46 for closing an upper opening of the chip mounting apparatus.

The chip mounting head supporting frame 41 is securely mounted on the base 40 so as to upwardly extend therefrom. The chip mounting head 42 is provided on a lower end of the frame 41 and has a suction nozzle 47. The head 42 is arranged so as to be reciprocated in the frame 41. Thus, the chip mounting head 42 is moved in the frame 41 so as to permit the suction nozzle 47 to pick up a chip D from the chip feed section 44 and place it on a board 8 already coated with the paste solder.

In the chip mounting apparatus thus constructed, the base 40, frame 41, and plastic cover 46 cooperate with each other to form an essential part of an enclosure which defines a treating space T for chip mounting. The treating space T has a dry air atmosphere for chip mounting of a pressure slightly higher than that of an atmosphere outside the treating space T. Thus, the treating space T defines an enclosure for the board 8 and mounting head 42 and has a dry air atmosphere of a pressure slightly higher than that of an atmosphere outside the treating space T. The chip mounting apparatus also has an elastic porous member for closing any gap which may possibly exist on a side surface of the apparatus. For example, a sponge material may be used for this purpose. Thus, the treating space T for chip mounting is a substantially sealed space which is surrounded by the base 40, frame 41 and plastic cover 46. It is not, however, necessarily required to construct the treating space T for chip mounting into a fully airtight structure so long at it forms a dry air atmosphere of a pressure slightly higher than that of an atmosphere outside the treating space T. For this purpose, the chip mounting apparatus may have an opening for the dry air feed section 45 having an area larger than an area of the gap.

The dry air feed section 45 is formed with an air outlet, which is provided with a porous member 48 made of sintered metal or the like, dry air is fed through the porous member 48 to the treating space T for chip mounting, which is defined by the base 40, frame 41 and plastic cover 46. The dry air is fed substantially without a flow velocity or while substantially being kept from having a flow velocity. The air outlet or opening of the dry air feed section 45 is desirably arranged at a position which keeps a dry air stream from blowing directly onto the board 8. For example, it may be arranged at a height corresponding to an upper portion of the chip mounting head 42. The dry air desirably has a humidity of 20% or less.

Figure 7:
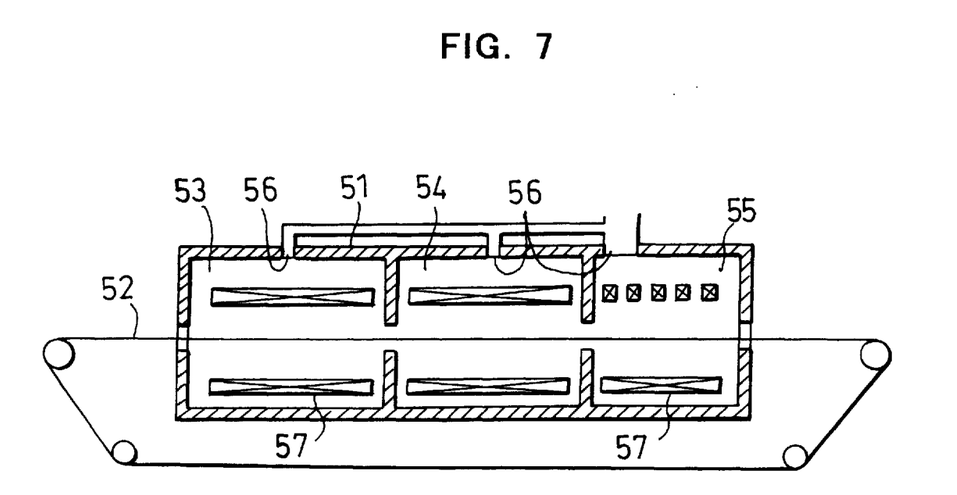
FIG. 7 is a schematic front view in section showing a reflow oven which maybe incorporated in the present invention.

The reflow oven may be constructed in such a manner as shown in FIG. 7. FIG. 7 shows an oven body 51 of the non-closed type and a conveyor 52. The oven body 51 is partitioned into preheating sections 53 and 54 and reflow section 55, each of which has a heater 57 arranged therein. The preheating sections 53 and 54 and reflow section 55 may each be fed with dry air through a dry air feed passage 56.

Thus, boards having a chip or chips mounted thereon in the chip mounting apparatus as described above, are transferred into the oven body 51 in order by a conveyor 52. The board is subjected to reflow soldering in a dry air atmosphere in the oven body 51. Dry air fed to the oven body 51 desirably has a humidity of 20% or less. The dry air may be fed by the dry unit 20 described above with reference to FIG. 4.

The method of chip soldering or chip mounting by soldering will now be described.

First, the printing step 30 shown in FIG. 5 is executed in the screen printing apparatus shown in FIG. 2, wherein the board 8 is placed on the X-Y table 7 and the printing screen 5 is superposed on the board 8. Paste solder H is printed or coated on the board 8 through the printing screen 5 by the squeegee 11. Coating of the paste solder H by printing is carried out in a dry air atmosphere formed in the treating space S, in which the board 8, screen 5 and squeegee 11 are arranged. The treating space S is maintained at a pressure slightly higher than the outside the space S. The dry air atmosphere is substantially kept from having flow velocity and has a humidity of 20% or less. Thus, the screen printing is effectively accomplished while preventing deterioration of paste solder H due to moisture or by preventing moisture from being absorbed by a flux ingredient of the paste solder H.

The board 8 which has been thusly coated with the paste solder H is then subjected to the chip mounting step 31 (FIG. 5) in the chip mounting apparatus shown in FIG. 6. More particularly, the board 8 is transferred to the X-Y table 43 of the chip mounting apparatus shown n FIG. 6 and then the suction nozzle 47 arranged on the lower end of the chip mounting head 42 is moved to pick up a chip D from the chip feed section 44 and mount it on the board 8. The board 8 and mounting head 42 are arranged in the treating space T of the chip mounting apparatus. The chip mounting may be likewise executed in a dry air atmosphere formed in the treating space T which is kept at a pressure slightly higher than the outside the space T. The dry air atmosphere is kept substantially free from a flow velocity and has a humidity of 20% or less. Thus, the chip mounting is accomplished without causing deterioration of paste solder H due to moisture or prevents moisture from being absorbed by the flux ingredient of the paste solder H.

Then, the board 8 is subjected to the reflow soldering step 32 (FIG. 5) in the reflow oven shown in FIG. 7. More particularly, the board which has been subjected to the chip mounting in the chip mounting apparatus is transferred to the conveyor 52 of the reflow oven shown in FIG. 7. The board is transported into the oven body 51 by the moving conveyor 52. In the oven body 51, the paste solder on the board 8 is melted, resulting in reflow soldering of the chip to the board. The reflow soldering may be likewise carried out in a dry air atmosphere having a humidity of 20% or less.

Thus, the chip soldering of the illustrated embodiment exhibits satisfactory advantages. More specifically, the screen printing apparatus includes the enclosure defining the treating space S in which the board 8, printing screen 5 and squeegee 11 are arranged. The treating space S has a dry air atmosphere of a pressure slightly higher than that of an atmosphere outside the treating space S. Such construction prevents the paste solder from being deteriorated due to absorption of moisture by the flux ingredient of the solder during coating of the paste solder on the board 8 by printing. Also, it prevents condensation of moisture on the paste solder.

The chip mounting unit includes the enclosure defining the treating space T in which the board 8 and chip mounting head 42 are arranged. The treating space T has a dry air atmosphere of a pressure slightly higher than that of an atmosphere outside the treating space T. Such construction likewise prevents the paste solder from being deteriorated due to absorption of moisture by the flux ingredient of the solder during the chip mounting. Also, it prevents condensation of moisture on the paste solder and chip.

The reflow oven is fed with dry air to provide a dry air atmosphere in the oven body 51 for reflow soldering. Also, the screen printing and chip mounting prior to the flow soldering are executed in a dry air atmosphere. Such construction substantially prevents a deterioration in paste solder due to moisture throughout the whole processing. Also, it ensures satisfactory soldering while reducing a content of flux in the paste solder, to thereby prevent generation of solder balls and eliminate cleaning of the board after soldering the chip to the board.

Further, the illustrated embodiment permits dry air having a humidity of 20% or less to be fed to each of the screen printing apparatus, chip mounting apparatus and reflow oven. This further prevents the generation of solder balls.

In the illustrated embodiment, transfer of the board 8 to the screen printing apparatus, chip mounting apparatus and reflow oven desirably takes place in a dry air atmosphere. Also, the screen printing apparatus, chip mounting apparatus and reflow oven may be mutually connected so that through passages are kept at a dry air atmosphere, for example, of 20% or less in humidity, to thereby provide a continuous line.

The screen printing apparatus and chip mounting apparatus may be constructed in any desired manner so long as the screen printing apparatus includes the enclosure defining the treating space for printing have the board, printing screen and squeegee arranged therein, and the treating space has a dry air atmosphere. The treating space also has a pressure slightly higher than that of an atmosphere outside the treating space S and is kept substantially free from a flow velocity. The chip mounting apparatus likewise includes the enclosure defining the treating space for chip mounting having the board and chip mounting head arranged therein, wherein the treating space has a dry air atmosphere, a pressure slightly higher than that of an atmosphere outside the treating space, and is kept substantially free from a flow velocity.

As can be seen from the foregoing, the present invention permits screen printing of paste solder on a board and mounting of a chip or chips on the board. This is executed in a dry air atmosphere, to prevent absorption of moisture by the flux ingredient of the paste solder. This prevents the generation of solder balls, so that the soldering may be accomplished with increased reliability. Also, it minimized the generation of solder balls while reducing a content of flux content in the paste solder, to thereby eliminate the necessity of cleaning the board after soldering.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than a specifically described.

What is claimed is:

1. A screen printing of method comprising the step of carrying out screen printing of paste solder on a board in a dry air atmosphere so that generation of solder balls dissociated from a land of said board is substantially prevented during soldering.

2. A screen printing method as defined in claim 1, wherein said dry air atmosphere has a humidity of 20% or less.

3. A screen printing method as defined in claim 1, wherein said screen printing is executed in a substantially closed treating space while keeping said dry air atmosphere at a pressure slightly higher than that of an atmosphere outside said treating space.

4. A screen printing method as defined in claim 2, wherein said screen printing is executed in a substantially closed treating space while keeping said dry air atmosphere at a pressure slightly higher than that of an atmosphere outside said treating space.

5. A screen printing apparatus comprising:
   a printing screen;
   a squeegee movable on said printing screen; and
   an enclosure in which a treating space having a board, said printing screen and said squeegee for application of paste solder arranged therein is defined;
   said treating space being formed therein with a dry air atmosphere of a pressure slightly higher than that of an atmosphere outside said treating space.

6. A method for soldering an electronic component comprising the steps of:
   executing screen printing of paste solder on a board;
   mounting an electronic component on the board to which the paste solder is applied; and
   subjecting the board mounted thereon with the electronic components to reflow soldering;
   said screen printing being executed in a dry air atmosphere so that generation of solder balls dissociated from the land of said board is substantially prevented during soldering.

7. A method for soldering an electronic component as defined in claim 6, wherein said mounting of the electronic component is carried out in a dry air atmosphere.

8. A method for soldering an electronic component as defined in claim 7, wherein said reflow soldering is carried out in a dry air atmosphere.

9. A method for soldering an electronic component as defined in claim 6, wherein said dry air atmosphere has a humidity of 20% or less.

10. A method for soldering an electronic component as defined in claim 7, wherein said dry air atmosphere in which said mounting of the electronic component is carried out has a humidity of 20% or less.

11. A method for soldering an electronic component as defined in claim 8, wherein said dry air atmosphere in which said reflow soldering is carried out has a humidity of 20% or less.

12. A method for soldering an electronic component as defined in claim 6, wherein said screen printing is executed in a substantially closed treating space while keeping said dry air atmosphere at a higher pressure than that of an atmosphere outside said treating space.

13. A method for soldering an electronic component as defined in claim 7, wherein said mounting of the electronic component is executed in a substantially closed treating space while keeping said dry air atmosphere at a higher pressure than that of an atmosphere outside said treating space.

14. An apparatus for soldering an electronic component comprising:

a screen printing unit for applying paste solder arranged on a printing screen to a board by printing while superposing said printing screen on the board;

a mounting unit for mounting, by means of a mounting head, an electronic component on the board to which the paste solder is applied by printing; and a reflow oven including an oven body provided therein with a heater and constructed so as to melt the paste solder on the board mounted thereon with the electronic component, to thereby carry out reflow soldering;

said screen printing unit including an enclosure in which a treating space having the board, said printing screen and a squeegee arranged therein is defined;

said treating space being formed therein with a dry air atmosphere of a pressure slightly higher than that of an atmosphere outside said treating space.

15. An apparatus for soldering an electronic component as defined in claim 14, wherein said mounting unit includes a second enclosure in which a second treating space having the board and said mounting head arranged therein is defined;

said second treating space being formed therein with a dry air atmosphere of a pressure slightly higher than that of an atmosphere outside said second treating space.

16. An apparatus for soldering an electronic component as defined in claim 14, wherein said oven body of said reflow oven is fed therein with dry air to form a dry air atmosphere in said oven body.

17. An apparatus for soldering an electronic component as defined in claim 15, wherein said oven body of said reflow oven is fed therein with dry air to form a dry air atmosphere in said oven body.

* * * * *

UNITED STATES PATENT AND TRADEMARK OFFICE
CERTIFICATE OF CORRECTION

PATENT NO.   : 6,036,084
DATED        : March 14, 2000
INVENTOR(S)  : Yagi, et al.

It is certified that error appears in the above-identified patent and that said Letters Patent is hereby corrected as shown below:

Column 1,
Line 15, "chip" should read -- "chip") --.
Line 26, "[No] soldering" should read -- No soldering --.

Column 2,
Line 34, "space has" should read -- space and has -- .

Column 3,
Line 23, "present invention" should read -- present invention; --
Line 29, "maybe" should read -- may be --.

Column 4,
Line 1, "board 8," should read -- board 8. --
Line 2, "printing screen" should read -- Printing screen --.
Line 3, "spaces." should read -- space --.
Line 47, "pressure is" should read -- pressure that is --.

Column 5,
Line 9, "according to method" should read -- according to a method --.
Line 9, "an other" should read -- another --.

Column 6,
Line 28, "than the outside" should read -- than outside --.
Line 45, "than the outside" should read -- than outside --.

UNITED STATES PATENT AND TRADEMARK OFFICE
CERTIFICATE OF CORRECTION

PATENT NO. : 6,036,084
DATED : March 14, 2000
INVENTOR(S) : Yagi, et al.

It is certified that error appears in the above-identified patent and that said Letters Patent is hereby corrected as shown below:

<u>Column 7,</u>
Line 57, "it minimized" should read -- it minimizes --.
Line 66, "than a" should read -- than as --.

Signed and Sealed this

Seventh Day of August, 2001

*Attest:*

*Attesting Officer*

NICHOLAS P. GODICI
*Acting Director of the United States Patent and Trademark Office*